United States Patent
Liaw et al.

[19]

[11] Patent Number: 5,866,449
[45] Date of Patent: Feb. 2, 1999

[54] METHOD OF MAKING POLYSILICON-VIA STRUCTURE FOR FOUR TRANSISTOR, TRIPLE POLYSILICON LAYER SRAM CELL INCLUDING TWO POLYSILICON LAYER LOAD RESISTOR

[75] Inventors: Jhon-Jhy Liaw, Taipei; Jin-Yuan Lee, Hsin-Chu, both of Taiwan

[73] Assignee: Taiwan Semiconductor Manufacturing Company Ltd., Hsin-Chu, Taiwan

[21] Appl. No.: 958,426

[22] Filed: Oct. 27, 1997

[51] Int. Cl.[6] .................................................. H01L 21/8244
[52] U.S. Cl. ......................... 438/238; 438/586; 438/657
[58] Field of Search ................................... 438/238, 382, 438/383, 384, 586, 592, 655, 656, 657

[56] References Cited

U.S. PATENT DOCUMENTS

| | | | |
|---|---|---|---|
| 5,187,114 | 2/1993 | Chan et al. | 438/238 |
| 5,393,689 | 2/1995 | Pfiester et al. | 438/238 |
| 5,422,499 | 6/1995 | Manning | 257/67 |
| 5,521,113 | 5/1996 | Hsue et al. | 437/52 |
| 5,545,584 | 8/1996 | Wuu et al. | 438/238 |
| 5,547,892 | 8/1996 | Wuu et al. | 437/52 |
| 5,585,302 | 12/1996 | Li | 438/586 |

*Primary Examiner*—Chandra Chaudhari
*Attorney, Agent, or Firm*—George O. Saile; Stephen B. Ackerman; Graham S. Jones, II

[57] ABSTRACT

This is a method of forming an SRAM transistor cell on a well in a doped semiconductor substrate. Form a gate oxide layer and a split gate layer with buried contact regions in the well and openings through the split gate layer and the gate oxide layer to the well. Form an intermediate conductor layer and a hard silicon oxide mask layer and define gate conductors. Form lightly doped source/drain regions, form spacers and source/drain regions in the well. Form a first inter-conductor dielectric layer on the cell. Define a self-aligned contact region in the cell above source/drain regions. Form a second conductor layer over the cell and patterning the second conductor layer to form a via in the self-aligned contact region. Form a second inter-conductor dielectric layer on the cell, a third conductor layer over the cell and patterning the third conductor layer to form a first resistor connected to the self-aligned contact region.

15 Claims, 5 Drawing Sheets

METHOD OF MAKING POLYSILICON-VIA STRUCTURE FOR FOUR TRANSISTOR, TRIPLE POLYSILICON LAYER SRAM CELL INCLUDING TWO POLYSILICON LAYER LOAD RESISTOR

BACKGROUND OF THE INVENTION

1. Field of the Invention

This invention relates to semiconductor memory devices and more particularly to a method of manufacturing forming a via structure in a MOSFET Static Random Access Memory (SRAM) cell and the device manufactured thereby.

2. Description of Related Art

U.S. Pat. No. 5,521,113 of Hsue et al. for "Process for Forming a Butting Contact Through a Gate Electrode" shows a method for forming a butting contact through a gate electrode. However, Hsue et al does not show a butt contact between the second and third polysilicon layers.

U.S. Pat. No. 5,422,499 of Manning for "Sixteen Megabit Static Random Access Memory (SRAM) Cell" shows an SRAM cell with a second layer of polysilicon extending over co-planar surfaces in contact with the third polysilicon region that establishes a contact between the TFT drain and the pull down transistor. However, Manning differs from the invention in the configuration of the butting contacts.

U.S. Pat. No. 5,547,892 of Wuu et al. for "Process for Forming Stacked Contacts and Metal Contacts on Static Random Access Memory Having Thin Film Transistors" shows a process for forming a stacked contact for an SRAM device.

As the design rules are reduced for high density memories, the trend is to use the shallow trench isolation process to replace the well known LOCOS (LOCal Oxidation of Silicon) process. A polysilicon via (or Butt-contact structure) has been used for SRAM cell designs. But that approach is hampered by the problem of butt-contact short-circuits to the P-well of a device due to misalignment of the polysilicon gate to active regions or polysilicon_via (or butt-contact) misalignment to the active region.

In the past the VLSI manufacturing process, a problem has existed in that the area of source/drain regions could not be minimized because it was necessary to align the contact hole with the source/drain regions by using a separate masking step and an extra area had to be allocated to compensate for the probability of misalignment.

SUMMARY OF THE INVENTION

The problems solved by this invention are first that it provides for immunity of a polysilicon_via (or butt contact) from being short-circuited to the P-well.

Secondly, this invention minimizes the area of a polysilicon Via relative to the rules. For example, active region extension to the butt contact and the first polysilicon layer extension to the polysilicon via are provided by this invention.

In accordance with this invention, a method is provided for forming an SRAM transistor cell on a doped semiconductor substrate which includes the following steps.

Form buried contact areas in a well in the substrate, a first conductor layer on the well; and a hard silicon oxide mask layer over the first conductor layer.

Define gate conductors from the first conductor layer.

Form lightly doped source/drain regions in the well, form spacers in the well, form source/drain regions in the well and form a first inter-conductor dielectric layer on the cell.

Define a self-aligned contact region in the cell above at least one of the source/drain regions.

Form a second conductor layer over the cell and patterning the second conductor layer to form a via in the self-aligned contact region, form a second inter-conductor dielectric layer on the cell.

Form a third conductor layer over the cell and patterning the third conductor layer to form a first resistor connected to the self-aligned contact region.

Form the self-aligned contact regions to a source region and a drain region with an interconnection to the buried contact.

The first conductor layer comprises a layer selected from the group of polysilicon and polysilicon/polycide.

The second conductor layer comprises a lamination of polysilicon and tungsten silicide.

The hard silicon oxide mask layer is composed of a material formed from the group consisting of PETEOS and LPTEOS.

The first inter-conductor dielectric layer is composed of a material formed from the group consisting of LPTEOS and PETEOS.

The second inter-conductor dielectric layer is composed of a material formed from the group consisting of LPTEOS and PETEOS.

In accordance with another aspect of the invention, form an SRAM transistor cell on a well in a semiconductor substrate thereof by the steps as starting by forming a gate oxide layer over the well. Form a split polysilicon layer over the gate oxide layer; form buried contact areas in a well in the substrate etching away portions of the split polysilicon layer and the gate oxide layer; and form buried contact regions in the well.

Deposit a lower conductor layer selected from the group consisting of a polysilicon layer and a lamination of a polysilicon layer and a polycide layer.

Pattern the lower conductor layer into a gate conductor electrode.

Perform LDD photolithography and ion implant LDD regions into the well adjacent to the gate conductor electrode.

Form spacers adjacent to the gate conductor electrode.

Perform source/drain photolithography and ion implanting.

Form a first inter-conductor dielectric layer on the cell.

Define a self-aligned contact region in the cell above at least one of the source/drain regions.

Form a second conductor layer over the cell and patterning the second conductor layer to form a via in the self-aligned contact region.

Form a second inter-conductor dielectric layer on the cell.

Form a third conductor layer over the cell and patterning the third conductor layer to form a first resistor connected to the self-aligned contact region.

Form the self-aligned contact regions to a source region and a drain region with an interconnection to the buried contact.

The first conductor layer comprises a layer selected from the group of polysilicon and polysilicon/polycide. The second conductor layer comprises a lamination of polysilicon and tungsten suicide.

The hard silicon oxide mask layer is composed of a material formed from the group consisting of PETEOS and LPTEOS.

The first inter-conductor dielectric layer is composed of a material formed from the group consisting of LPTEOS and PETEOS.

The second inter-conductor dielectric layer is composed of a material formed from the group consisting of LPTEOS and PETEOS.

In accordance with another aspect of this invention, a method of forming an SRAM transistor cell on a doped semiconductor substrate includes the following steps.

Form a gate oxide layer over the substrate.

Form a split polysilicon layer on the gate oxide layer.

Form buried contact areas in a well in the substrate etching away portions of the split polysilicon layer and the gate oxide layer.

Form a lower conductor layer selected from the group consisting of a polysilicon layer and a lamination of a polysilicon layer and a polycide layer over the split polysilicon layer and reaching down into contact with the substrate in the buried contact areas.

Form a hard silicon oxide mask layer over the first conductor layer.

Define gate conductors from the first conductor layer.

Form lightly doped source/drain regions in the well.

Form spacers in the well.

Form source/drain regions in the well.

Form a first inter-conductor dielectric layer on the cell.

Define a self-aligned contact region in the cell above at least one of the source/drain regions.

Form a second conductor layer over the cell and patterning the second conductor layer to form a via in the self-aligned contact region.

Form a second inter-conductor dielectric layer on the cell.

Form a third conductor layer over the cell and patterning the third conductor layer to form a first resistor connected to the self-aligned contact region.

Form a first pass transistor and a second pass transistor, each having a source region, a drain region and a gate conductor.

Form a first pull-down transistor and a second pull-down transistor each having a source region, a drain region and a gate conductor.

Form a first node and a second node.

Form a first load resistor having one end connected to the first node and the other end thereof connected to the power supply connection.

Form a second load resistor having one end connected to the second node and the other end thereof connected to the power supply connection.

Form a bit line and a bit line bar.

Form first and second interconnection lines.

The first pull-down transistor having the drain region thereof connected to the first node.

The second pull-down transistor having the drain region thereof connected to the second node.

The first and second pull-down transistors have the source regions thereof connected together.

The first node is cross connected via the first interconnection line to the gate conductor of the second transistor.

The second node is cross connected via the second interconnection line to the gate conductor of the first transistor.

The gate conductors of the first and second pass transistors are connected to a wordline.

Connect the drain region of the first pass transistor to the first node.

Connect the drain region of the second pass transistor to the second node.

Connect the source region of the first pass transistor to the bit line bar.

Connect the source region of the second pass transistor to the bit line.

Another aspect of this invention comprises an SRAM transistor cell formed on a doped semiconductor substrate. A first pass transistor and a second pass transistor each having a source region, a drain region and a gate conductor formed from a first conductor layer. There are SAC structures composed of a second conductor layer forming connections to the source region and the drain region, and a third conductor layer forming a load resistor and a butted contact to a SAC structure to one of the source region and the drain region.

A buried contact connects to the one of the source region and the drain region.

A first pull-down transistor and a second pull-down transistor each having a source region, a drain region and a gate conductor.

A first node and a second node are provided.

A first load resistor has one end connected to the first node and the other end thereof connected to the power supply connection.

A second load resistor has one end connected to the second node and the other end thereof connected to the power supply connection.

A bit line and a bit line bar first and second interconnection lines are provided.

The first pull-down transistor has the drain region thereof connected to the first node.

The second pull-down transistor has the drain region thereof connected to the second node.

The first and second pull-down transistors have the source regions thereof connected together.

The first node is cross connected via the first interconnection line to the gate conductor of the second transistor.

The second node cross connected via the second interconnection line to the gate conductor of the first transistor.

The gate conductors of the first and second pass transistors connecting to a wordline.

The drain region of the first pass transistor connects to the first node.

The drain region of the second pass transistor connects to the second node.

The source region of the first pass transistor connects to the bit line bar.

The source region of the second pass transistor connects to the bit line.

An SRAM transistor cell on a doped semiconductor substrate in accordance with this invention includes the buried contact areas in a well in the substrate, a first conductor layer on the well, a hard silicon oxide mask layer over the first conductor layer, and gate conductors formed from the first conductor layer. There are lightly doped source/drain regions in the well, spacers in the well, source/drain regions in the well and a first inter-conductor dielectric layer on the cell.

A self-aligned contact region in the cell lies above at least one of the source/drain regions.

There is a second conductor layer over the cell patterned to form a via in the self-aligned contact region, plus a second inter-conductor dielectric layer on the cell. A third conductor layer overlies the cell patterned to form a first resistor connected to the self-aligned contact region.

Other aspects of the method of this invention result in additional features in the devices manufactured in accordance with this invention as can be seen by review of the above features.

BRIEF DESCRIPTION OF THE DRAWINGS

The foregoing and other aspects and advantages of this invention are explained and described below with reference to the accompanying drawings, in which:

FIG. 1A is a plan view of a via formed in accordance with this invention.

FIG. 1B is a section taken along line 1B—1B' of FIG. 1A.

FIG. 1C is a section taken along line 1C—1C' of FIG. 1A.

FIG. 5A is a plan view of a via in such an SRAM circuit.

FIG. 5B is a section taken along line 5B—5B' of FIG. 5A.

FIG. 5C is a section taken along line 5C—5C' of FIG. 5A.

DESCRIPTION OF THE PREFERRED EMBODIMENT

In the VLSI manufacturing process in accordance with this invention, the area of source/drain regions is minimized because it is unnecessary to align the contact hole with the source/drain regions. No extra area has to be allocated to compensate for the probability of misalignment. The Self-Aligned Contact (SAC) technology is used in a triple polysilicon process to make the desired connections in an SRAM cell. The SAC technology as used in accordance with this invention reduces the distances between the contact within the device, for example the distance between the contact and the gate. A first level of polysilicon is used for the gate of a set of MOSFET transistors. A second level of polysilicon covered with polycide is used for the $V_{ss}$ power line in a memory array included with device 8, as well as, for the landing pad for bit line contacts. The third level of polysilicon is used to form both the high resistance load resistors and the low-resistance $V_{dd}$ lines. The $V_{ss}$ contacts and bit line contacts are formed with the SAC structures to reduce cell size.

Figure 1A:
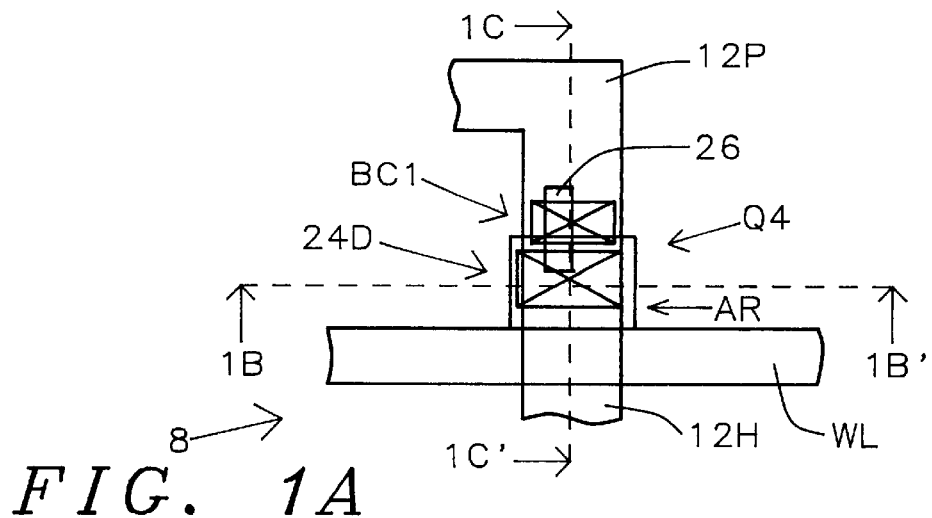
FIGS. 1A–1C show views of portions of an SRAM circuit in accordance with this invention.
Figure 1B:
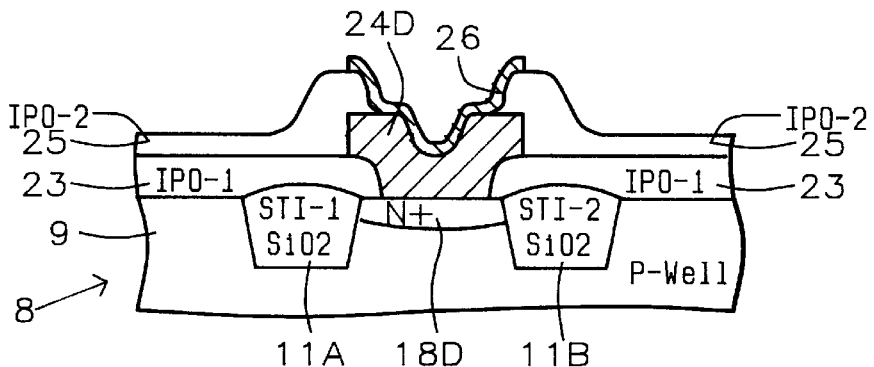
Figure 1C:
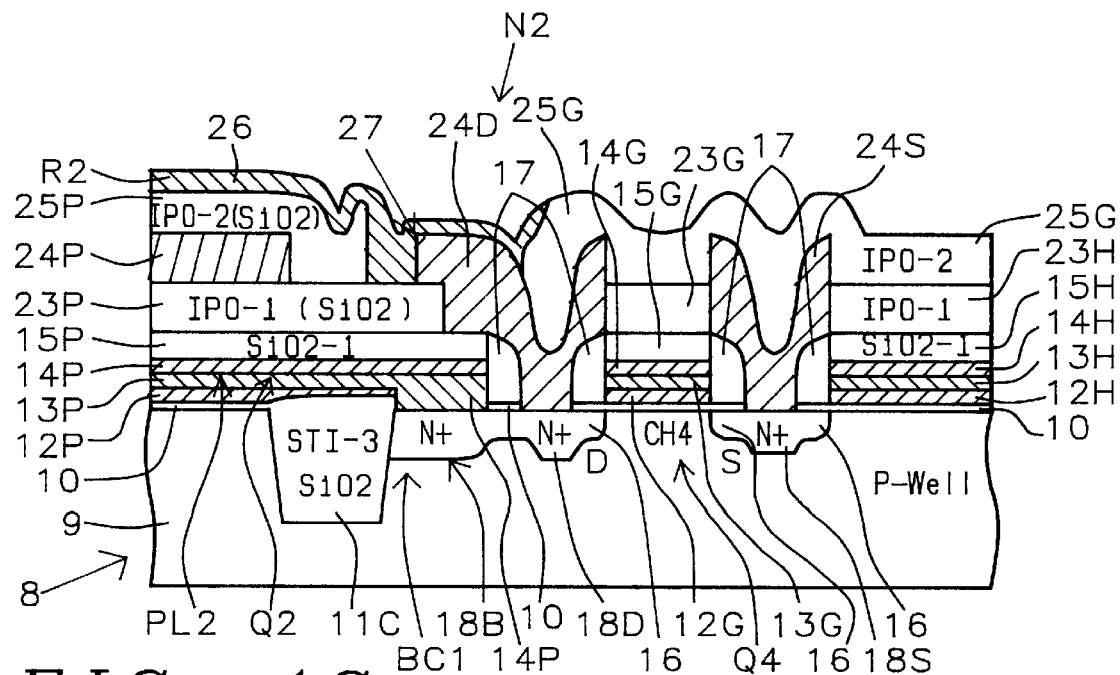

FIGS. 1A–1C show views of portions of an SRAM circuit in accordance with this invention, where FIG. 1A is a plan view of a via 24D formed in accordance with this invention.

FIG. 1B is a section taken along line 1B—1B' of FIG. 1A.

FIG. 1C is a section taken along line 1C—1C' of FIG. 1A.

Figure 3:
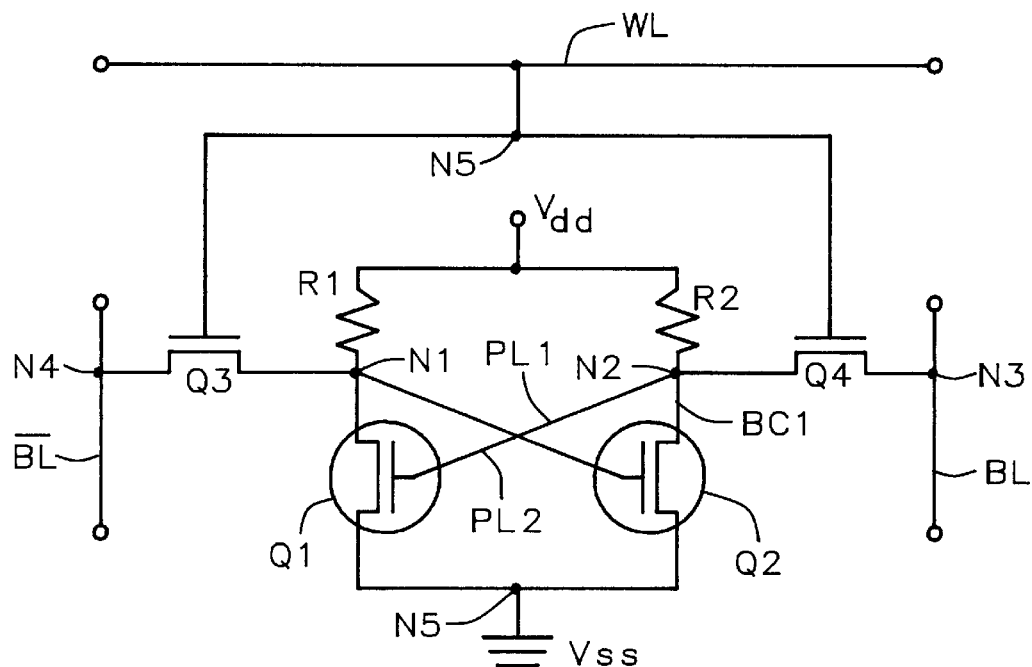
FIG. 3 shows a four transistor SRAM cell with cross-coupled pull down (storage/driver) NMOS transistors, a pair of polysilicon load resistors and pass (access/transfer) NMOS transistors.

The SRAM circuit shown in FIG. 3, as embodied in FIGS. 1A–1C is formed in a P-well 9 in a silicon substrate (not shown for convenience of illustration) of a SRAM cell 8 comprising a CMOS device with a polysilicon-via structure 24D formed of a third polysilicon layer 26 which forms a butted contact 27 as seen in FIG. 1C, which provides for connection to the drain of a pass transistor Q4 and a first Buried Contact BC1 region 18B to the drain of the pull-down transistor Q2. The split polysilicon layer 12 is shown with the active region AR shown where the pass transistor Q4 is located.

FIG. 1A is a plan view of a via 24D formed by a portion of a second polysilicon layer 24 which is in the form of a Self-Aligned Contact (SAC) indicating the location of a first Buried Contact BC1 to the drain of pull-down transistor Q2. A Word Line WL and the pattern of the split polysilicon layer 12 as indicated by split polysilicon layer portion 12P on the top and split polysilicon layer portion 12H.

In FIG. 1B the SRAM cell 8 is shown with the Shallow Trench Isolation (STI) structures STI-1 11A and STI-2 11B formed in the surface in the P-well 9. STI structures STI-1 11A and STI-2 11B are formed of conductive second polysilicon layer 24 on either side of an N+ doped drain region 18D of the pass transistor Q4 also formed in the surface of P-well 9. Above the drain region 18D is formed the SAC via 24D formed in the first Inter-Polysilicon Oxide (IPO-1) layer 23. Upon portions of the IPO-1 layer 23 and around the via 24D is formed a second IPO-2 layer 25. In second IPO-2 layer 25 with a polysilicon 3 layer 26 has been formed centered on the top of the SAC via 24D has been formed a butted contact to the via 24D.

In FIG. 1C the SRAM cell 8 is shown with a third Shallow Trench Isolation (STI) structure STI-3 11C formed in the surface in the P-well 9 on the left side of an N+ doped first buried contact BC1 region 18B. To the right of the first buried contact BC1 region 18B is the drain region 18D of transistor Q4 formed in P-well 9. Next on the right is the channel CH4 of transistor Q4 followed by the source region 18S of pass transistor Q4. A set of Lightly Doped Drain/source regions 16 (conventionally known as LDD regions) are formed in P-well 9 on either side of the drain/source regions 18D/18S. The first buried contact BC1 region 18B and the drain region 18D are electrically connected at node N2 in FIG. 3 by one of the LDD regions 16, as can be seen in FIG. 1C.

Above the surface of P-well 9, a gate oxide layer 10 is formed with a first opening therethrough for the via 24D which contacts the drain region 18D in a Self-Aligned Contact (SAC) formed between dielectric spacers 17 and a second opening therethrough for the via 24S which contacts the source region 18S in a Self-Aligned Contact (SAC) formed between dielectric spacers 17. There is also an opening through gate oxide layer 10 for portion 13P of an intermediate polysilicon layer which forms the buried contact BC1 to N+ region 18B. The laminated conductor 12P/13P/14P (comprising split polysilicon layer portion 12P, intermediate polysilicon layer portion 13P and polycide layer portion 14P) form a connection through cross-coupled line PL2 in FIG. 3, as is described below. The shallow trench isolation region STI-3 11C also reaches up through the gate oxide layer 10 beneath the laminated conductor 12P/13P/14P.

Above the gate oxide layer 10, a blanket split polysilicon layer 12 has been patterned into the first layer 12P of cross-coupled line PL2, the lowest layer 12G of a gate electrode, and first layer 12H of a conductor located to the right of via 24S and spacer 17. Above the split polysilicon layer 12 and the buried contact BC1 is formed an intermediate polysilicon layer 13 in contact with N+ doped region 18B comprising first buried contact BC1. Then, in turn, tungsten silicide layer 14 is formed over intermediate polysilicon layer 13.

A silicon oxide hard mask layer 15 is formed above the split polysilicon layers 12, polysilicon layer 13 and polycide layer 14. In detail, mask layer 15 includes mask layer portion 15P above polycide layer portion 14P, mask layer portion 15G above gate electrode polycide layer 14G, and mask layer portion 15H above polycide layer portion 14H.

Above the silicon oxide hard mask layer 15 is formed a first Inter-Polysilicon Oxide (IPO-1) silicon dioxide layer 23 including silicon dioxide layer portion 23P above mask layer portion 15P, silicon dioxide layer portion 23G above mask layer portion 15G, and silicon dioxide layer portion 23H above mask layer portion 15H.

Above the silicon dioxide layer portion 23P is formed a second polysilicon layer 24 which includes a portion 24P spaced to the left of the via 24D on the top surface of IPO-1 silicon dioxide layer portion 23P. Portion 24P of second polysilicon layer 24 serves as the Vss power line for the memory array.

A second Inter-Polysilicon Oxide (IPO-2) silicon dioxide layer 25 was formed above the SRAM cell 8 including portion 24P of second polysilicon layer 24, the via 24D, and 24S, as well as, exposed portions of IPO-1. Those include IPO-1 portions 23P, 23G and 23H after formation and patterning of second polysilicon layer 24.

An opening was made through second IPO-2 layer 25 down to the surface of via 24D and a portion of the IPO-1 layer portion 23P to make the butted contact 27 (FIG. 1C) to via 24D for connection to the drain 18D.

A third polysilicon layer 26 was formed over the device 8 extending down into the surface of via 24D and the surface of IPO-1 portion 23P forming a high valued load resistor R2 and low resistance lines to the Vdd voltage source as seen in FIG. 3.

Figure 2A:
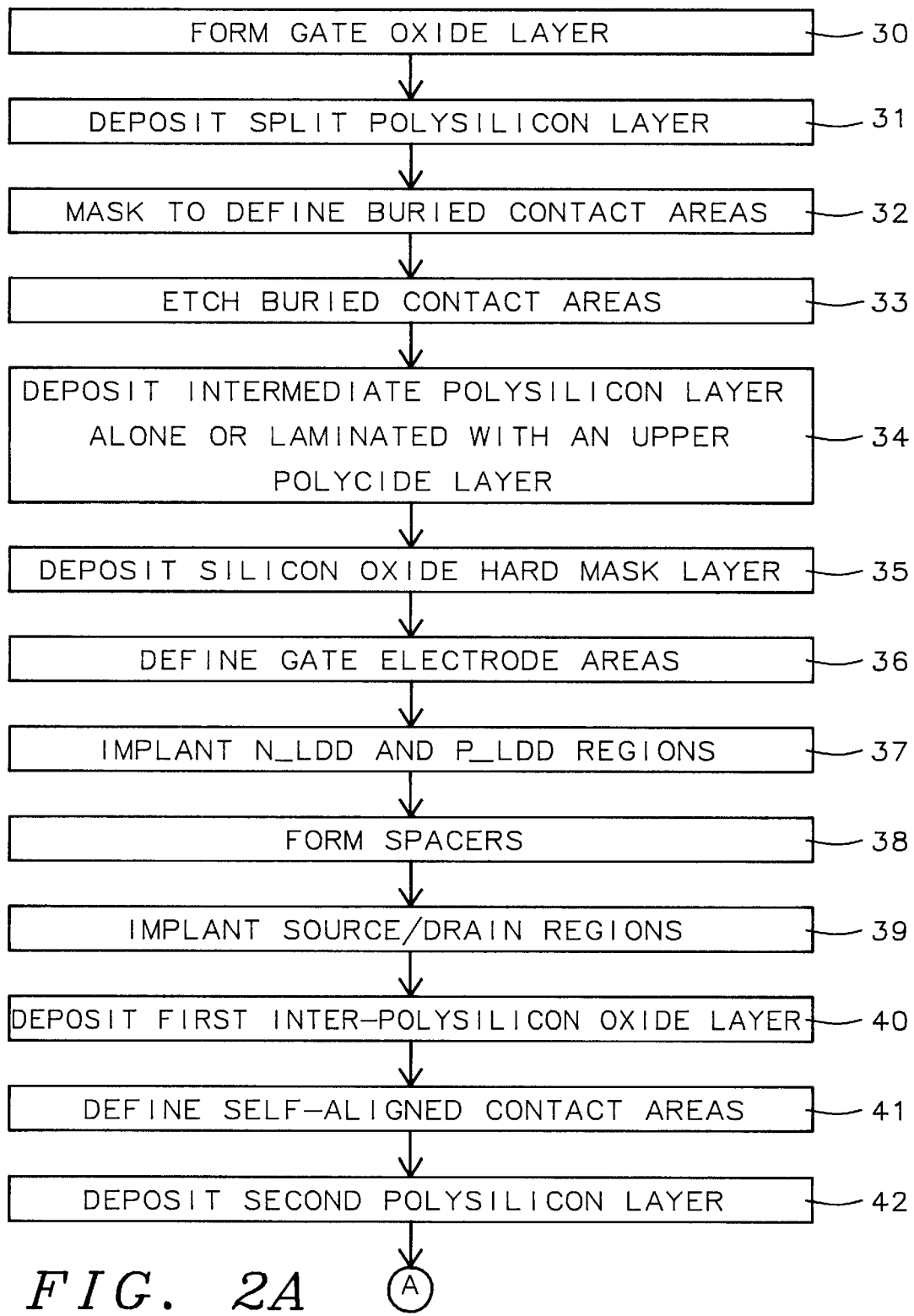
FIGS. 2A and 2B show the process flow for manufacture of the polysilicon via structure of FIG. 1C.
Figure 2B:
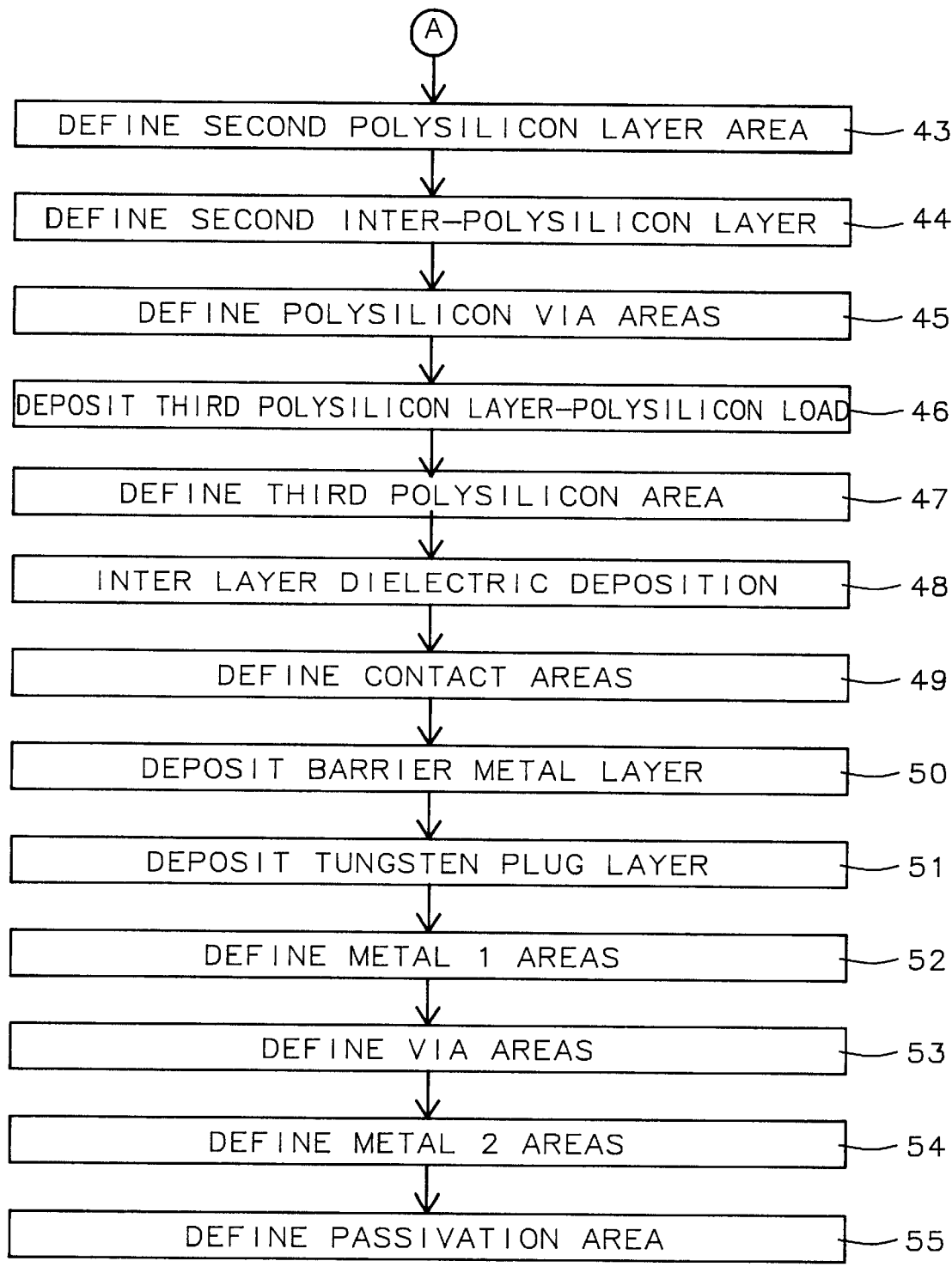

FIGS. 2A and 2B show the process flow for manufacture of the polysilicon via structure 24D of FIG. 1C, and the process flow is described below with reference to those drawings as well as FIGS. 1A–1C.

In process step 30 a gate oxide (silicon oxide) layer 10 is formed over the surface of SRAM cell 8. Gate oxide layer 10 is formed by conventional thermal oxidation in a furnace at a temperature from about 750° C. to about 950° C. to a thickness from about 35 Å to about 200 Å.

Figure 4:
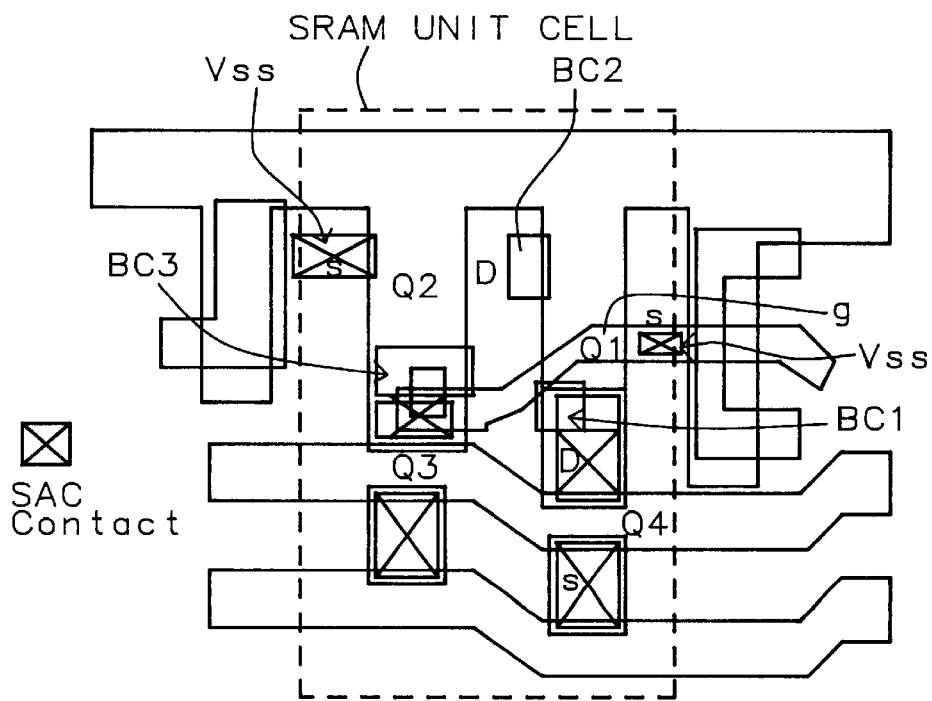
FIG. 4 shows the plan view of an overall device in accordance with this invention with the locations of buried contacts as well as transistors plus some source/drain regions S/D of the device and the voltage connections to ground (Vss).

In step 31 of the process a blanket split polysilicon layer 12 is formed above the gate oxide layer 10. Step 31 is the first step in a sequence of steps of forming a laminated structure composed of a split polysilicon layer 12 deposited in step 31, and the polysilicon layer layer 13 as well as polycide layer 14 deposited in step 34, as described below. The split polysilicon layer 12 has a thickness of about 550 Å. The split polysilicon layer 12 is deposited at this stage in the process to protect the gate oxide layer 10 during definition of the buried contact areas BC1, BC2, BC3, etc., as seen in FIG. 4.

Next, in step 32, a mask is formed over the doped SRAM cell 8 to define the buried contact areas BC1, BC2 and BC3, etc.

Next, in step 33, the buried contact areas BC1, BC2 and BC3, etc. are etched forming openings through the the split polysilicon layer 12 and gate oxide layer 10 to etch a contact window down to the P-well 9. This contact window comprises the buried contact window.

The subsequent step 34 is to deposit a set of in-situ doped polysilicon/polycide layers 13/14. The blanket polysilicon layer 13 which is deposited in step 34 reaches down to contact the buried contact BC1, BC2 and BC3, etc. areas formed in step 33. The intermediate polysilicon layer 13 is deposited over the remainder of split polysilicon layer 12 which was not etched away in step 33. Then, in turn, tungsten silicide layer 14 is formed over intermediate polysilicon layer 13. Layers 12, 13 and 14 are to be patterned various structures including gate electrodes, etc. as described elsewhere herein. The intermediate polysilicon layer 13 can be composed of polysilicon 13 alone with a thickness from about 300 Å to about 1,500 Å. In the case of the lamination of a polycide layer 14 over an intermediate polysilicon layer 13, the polycide layer 14 has a thickness from about 500 Å to about 2,000 Å formed over the intermediate polysilicon layer 13 with the same thickness of from about 300 Å to about 1,500 Å.

Then in step 35, a silicon oxide hard mask layer 15 is deposited preferably by a PETEOS (Plasma Enhanced TetraEthylOrthoSilicate) or LPTEOS (Low Pressure TEOS) process with a thickness from about 1,000 Å to about 2500 Å.

In step 36, a photoresist mask is formed to define gate electrode areas followed by etching the hard mask layer 15 and the split polysilicon layer 12.

Next, in step 37 Lightly Doped (LD) N-type and P-type regions are formed in a set of conventional N_LDD implants forming regions 16 in FIG. 1C and previously or subsequently in P_LDD region implants formed in the N-well (not shown).

In step 38 spacers 17 are formed by the conventional process of depositing a blanket silicon oxide layer followed by a conventional etch-back process.

Next, in step 39 N-type and P-type Source/Drain (S/D) regions are formed in a set of conventional N+ type and P+ type implants. The N+ type implants form regions 18B, 18D and 18S in P-well 9 as shown in FIG. 1C and previously or subsequently form P+ type implants in the N-well (not shown).

In step 40, the first Inter-Polysilicon Oxide (IPO-1) layer 23 is deposited preferably by a LPTEOS or PETEOS process with a thickness from about 1,000 Å to about 2,000 Å.

In step 41, the SAC (Self-Aligned Contact) areas are defined by forming SAC photolithographic masking followed by etching opening through the IPO-1 layer 23 in selected locations exposing the N+ drain and source regions 18D and 18S respectively in FIG. 1C.

In step 42, the second polysilicon layer 24 is deposited forming the $V_{ss}$ power line 24P in the memory array as well as for the landing pads 24D and 24S of bit line contacts to the N+ drain and source regions 18D and 18S respectively in FIG. 1C. The second polysilicon layer 24 preferably is composed of $WSi_x$ (Tungsten Silicide) with a preferred thickness of about 1,200 Å (with a thickness range from about 500 Å to about 2,000 Å) covered with an in-situ doped polysilicon layer with a preferred thickness of about 550 Å (with a thickness range from about 300 Å to about 1,500 Å).

In step 43, the pattern of the second polysilicon layer 24 is defined by forming photolithographic masking followed by etching away portions of the second polysilicon layer 24 in selected locations to form $V_{ss}$ power line 24P in the memory array and the landing pads 24D and 24S of bit line contacts to the N+ drain and source regions 18D and 18S respectively in FIG. 1C. The pads are provided for the third polysilicon layer 26 as can be seen in FIG. 1C for the connection to the drain region 18D.

In step 44, the second Inter-Polysilicon Oxide (IPO-2) layer 25 is deposited preferably by a LPTEOS or PETEOS process with a thickness from about 1,000 Å to about 2,000 Å.

In step 45, the via areas are defined by forming photolithographic masking for a polysilicon-via followed by etching openings through the IPO-2 layer 25 in selected locations exposing a portion of the surface of SAC structure 23" which has a contact to the drain region 18D in FIG. 1C.

In step 46, the third polysilicon layer 26 is deposited forming a layer to be formed into a polysilicon load shown in FIG. 1C starting with undoped polysilicon with a preferred thickness of about 550 Å (with a thickness range from about 300 Å to about 1,000 Å).

In step 47, the pattern of the third polysilicon layer 26 is defined by forming photolithographic masking followed by etching away portions of the third polysilicon layer 26 in selected locations to form the third polysilicon layer 26 respectively in FIG. 1C to form the butted contact 27 seen in FIG. 1C for connection to the drain region 18D.

In step 48, an Inter Layer Dielectric (ILD) layer (not shown in FIG. 1C) is deposited as an undoped silicon oxide layer formed preferably by PETEOS with a thickness from about 1,000 Å to about 2,000 Å and by BPTEOS from about 3,000 Å to about 12,000 Å and a BPTEOS flow from about 750° C. to about 900° C.

In step 49, there is a conventional process of defining contact areas including photolithography and etching.

Then in step 50 barrier metal layers are deposited in as layers of titanium (with a thickness range from about 100 Å to about 500 Å) followed by titanium nitride (with a thickness range from about 100 Å to about 1,500 Å).

Then in step 51 tungsten (W) plugs are formed by depositing a conventional W_plug (with a thickness range from about 3,000 Å to about 7,000 Å).

In steps 52–55, the conventional steps of defining Metal-1, via, Metal-2 and passivation areas are performed including sputtering the metal, photolithography to form masks for patterning the metal and etching away excess metal.

FIG. 3 shows a four transistor SRAM cell with cross-coupled pull down (storage/driver) NMOS transistors Q1 and Q2, a pair of polysilicon load resistors R1, R2 and pass (access/transfer) NMOS transistors Q3 and Q4.

Load resistors R1 and R2 are connected between power supply voltage Vcc and nodes N1 and N2 respectively. A current $I_1$ flows from a terminal Vcc through a first load resistor R1 towards node N1. A second current $I_2$ flows from the terminal Vcc through a second load resistor R2 towards node N2.

NMOS pull-down transistors Q1 and Q2 are devices formed in an N-well (not shown in FIGS. 1A–1C) in P-well 9 which have their drain regions connected respectively to nodes N1 and N2 and their control gate electrodes cross-coupled respectively through lines PL1 and PL2 to nodes N2 and N1. The source regions of pull-down transistors Q1 and Q2 are connected by node N5 to ground, i.e. the reference potential Vss.

Node N1 is connected by a butt contact through a SAC contact to the drain region of transistor Q1 and to the control gate electrode of pull-down transistor Q2. Load resistor R1 is connected between power supply voltage Vcc through node N1 and the SAC contact to the drains of transistors Q1 and Q3.

Node N2 is connected through buried contact BC1 to the drain region of transistor Q2. At the same time node N2 is also connected to the control gate electrode of transistor Q1. Load resistor R2 is connected between power supply voltage Vcc and through node N2 through the SAC contact 24D to the drains of transistor Q2 and transistor Q4.

Pass transistors Q3 and Q4, which are formed in a P-well 9, both have their control gate electrodes connected to the wordline WL through node N5.

Pass transistor Q4 has its control gate electrode connected to wordline WL. The S/D circuit of transistor Q4 seen in cross section in FIG. 1C is connected between node N2 and node N3, and is connected from its source region 18S through node N3 to the other bit line BL through via 24S.

Pass transistor Q3 has its control gate electrode connected to wordline WL. The source/drain (S/D) circuit is connected between node N1 and and node N4, and is connected via node N4 to a bit line BL-bar through a similar via which is not shown to avoid redundancy.

Load resistors R1 and R2 have resistance values in the range of $10^9$ ohms to $10^{11}$ ohms which permits substantial currents I1 and I2 in the range from about $10^{-9}$ amperes to $10^{-11}$ amperes.

FIG. 4 shows the plan view of an overall device in accordance with this invention with the locations of buried contact BC1, BC2 and BC3 and transistors Q1, Q2, Q3, and Q4 plus some of the source/drain regions SID of the device and the voltage connections to ground (Vss).

Problem Overcome by Invention

Figure 5A:
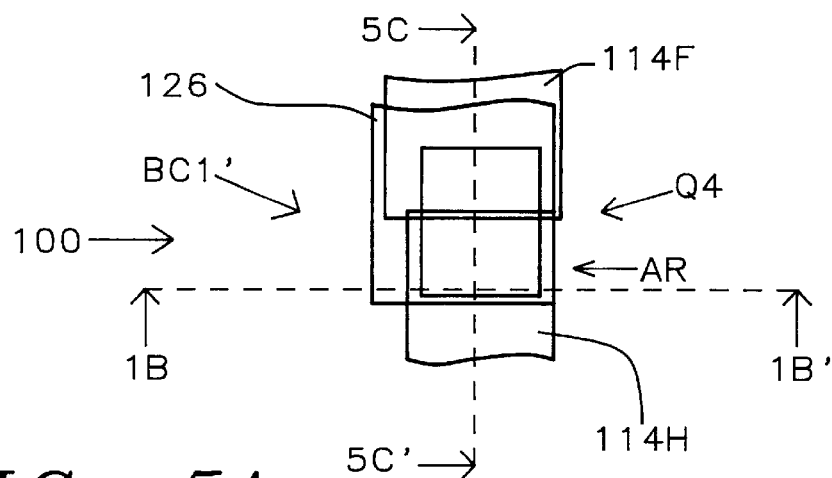
FIGS. 5A–5C show views of portions of an SRAM circuit formed without employing the method and structure provided by this invention.
Figure 5B:
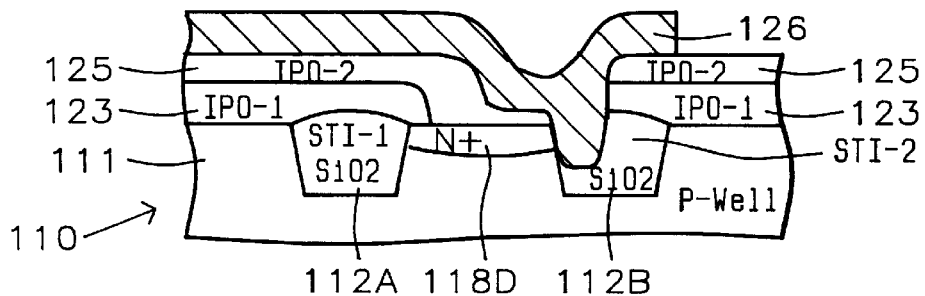
Figure 5C:
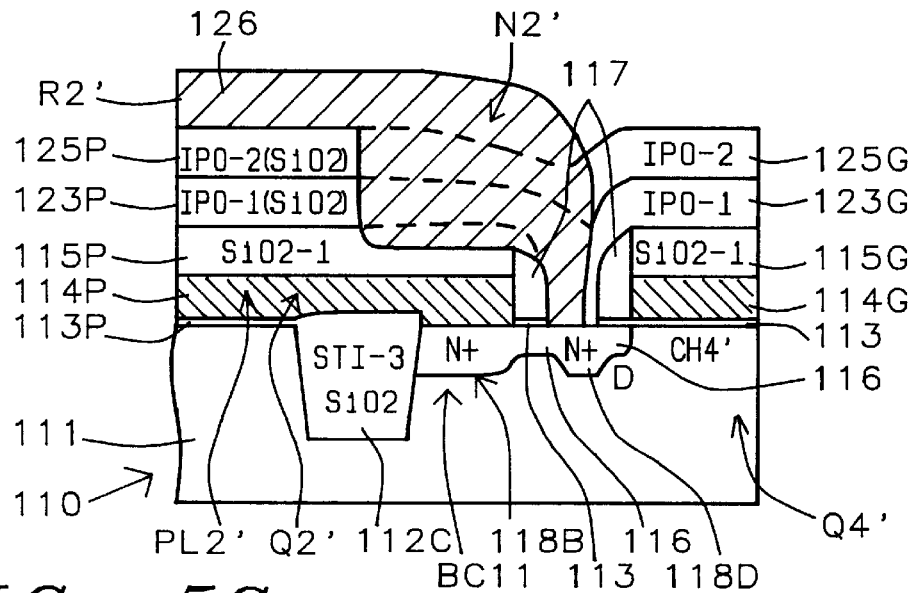

FIGS. 5A–5C show views of portions of an SRAM circuit without the advantages afforded by this invention included to show the problem encountered which necessitated the present invention.

FIGS. 5A–5C show views of portions of an SRAM circuit formed without employing the method and structure provided by this invention.

FIG. 5A is a plan view of a via in such an SRAM circuit formed without employing the method and structure provided by this invention.

FIG. 5B is a section taken along line 5B—5B' of FIG. 5A.

FIG. 5C is a section taken along line 5C—5C' of FIG. 5A.

An SRAM circuit as shown in FIG. 3 embodied by FIGS. 5A–5C is formed in a P-well 111 of a SRAM cell 110 with a polysilicon-via structure formed of a third polysilicon layer 126 which forms a contact which provides for connection to the drain of a pass transistor Q4' and a first Buried Contact BC1' region 118B to the drain of the pull-down transistor Q2'. The first polysilicon layer 114 is shown with the active region AR shown where the pass transistor Q4' is located.

FIG. 5A is a plan view of a via indicating the location of a first Buried Contact BC1' to the drain of pull-down transistor Q2'. The pattern of the first polysilicon layer 114 is shown. FIG. 5A indicates a misalignment problem with the design shown therein.

In FIG. 5B the SRAM cell 110 is shown with the Shallow Trench Isolation (STI) structures STI-1 112A and STI-2 112B formed in the surface in the P-well 111 on either side of an N+ doped drain region 118D of the pass transistor Q4' also formed in the surface of P-well 111. Above the drain region 118D is formed the via formed in the first Inter-Polysilicon Oxide (IPO-1) layer 123 and the second IPO-2 layer 125. On second IPO-2 layer 125 the polysilicon 3 layer 126 has been formed. FIG. 5B shows how the problem of overetching leads to etching of the STI-2 region 112B which would lead to a short-circuiting problem.

FIG. 5C shows the short-circuiting potential of the design of FIGS. 5A–5C because of the etching into the hard oxide 115P above the polysilicon layer 114P above buried contact BC1' as can be understood by reference to the following description of FIG. 5C wherein the SRAM cell 110 is shown with a third Shallow Trench Isolation (STI) structure STI-3 112C formed in the surface of the P-well 111 on the left side of an N+ doped first buried contact BC1 region 118B. To the right of the first buried contact BC1 region 118B is the drain region 118D of transistor Q4' formed in P-well 111. Next on the right is the channel CH4' of transistor Q4' followed by the source region (not shown) of pass transistor Q4'. Lightly Doped Drain/source regions 116 (LDD regions) are formed in P-well 111 on either side of drain region 118D, etc. The first buried contact BC1' region 118B and the drain region 118D are electrically connected at node N2 in FIG. 3 by one of the lightly doped drain regions 116 as can be seen in FIG. 5C.

Above the surface of P-well 111, a gate oxide layer 113 is formed with an opening for the via which contacts the drain region 118D formed between dielectric spacers 117 and an opening for the via which contacts the source region 118S between dielectric spacers 117. There is also an opening in gate oxide layer 113 for first polysilicon layer portion 114P which forms the buried contact BC1 to N+ region 118B. The shallow trench isolation region 112C also reaches up through the gate oxide layer 113 beneath the first polysilicon layer portion 114P.

Above the gate oxide layer 113, a blanket first polysilicon layer 114 has been patterned into the first polysilicon layer portion 114P, gate electrode 114G.

Above the polysilicon layer 114 is formed a silicon oxide hard mask 115 including portion 115P above polysilicon layer portion 114P, and mask portion 115G above gate electrode 114G.

Above the silicon oxide hard mask 115 is formed a first Inter-Polysilicon Oxide (IPO-1) silicon dioxide layer 123 including portion 123P above mask portion 115P, and portion 123G above mask portion 115G.

Above the silicon dioxide layer 123 portion 123P is formed a second Inter-Polysilicon Oxide (IPO-2) silicon dioxide layer 125 including IPO-2 portions 125P, 125G.

An opening was made through second IPO-2 layer 125 down to the surface of the via and a portion of the IPO-1 layer portion 123P to make the contact to the drain 118D.

A third polysilicon layer 126 was formed over the device 110 extending down into the surface of the via and the surface of IPO-1 portion 123P forming a high valued load resistor R2' and low resistance lines to the Vdd voltage source as seen in FIG. 3.

Advantages of the present invention are as follows:
1. Use of the buried contact BC1 to connect the drain region of the pass gate transistor Q4 to the drain of pull down transistor Q2.
2. Use of the buried contact BC1 to connect the drain region of the pass gate transistor Q4 to the gate of pull down transistor Q1.
3. The second polysilicon layer 24 forms Self-Aligned Contacts (SAC's) to the source regions ($V_{ss}$) of pull down transistors Q1 and Q2 at node N5.
4. The second polysilicon layer 24 forms Self-Aligned Contacts (SAC's) at nodes N1 and N2 to the drain regions of pass gate transistors Q3 and Q4.
5. The third polysilicon layer 26 connects to the polysilicon via 24D formed by the second polysilicon layer 24 to connect to the drain of a pass transistor.

Note that the third polysilicon layer contacts the second polysilicon layer at the second InterPolysilicon Oxide (IPO-2) level so that there is less misalignment and first polysilicon layer short-circuiting concern; and the second polysilicon layer connects the first polysilicon layer through Self-Aligned Contact (SAC) and Buried Contact (BC) which is a low resistance path.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming an SRAM transistor cell on a doped semiconductor substrate by the steps as follows:
   forming buried contact areas in a well in said substrate,
   forming a first conductor layer on said well,
   forming a hard silicon oxide mask layer over said first conductor layer,
   defining gate conductors from said first conductor layer,
   forming lightly doped source/drain regions in said well,
   forming spacers in said well,
   forming source/drain regions in said well,
   forming a first inter-conductor dielectric layer on said cell,
   defining a self-aligned contact region in said cell above at least one of said source/drain regions,
   forming a second conductor layer over said cell and patterning said second conductor layer to form a via in said self-aligned contact region,
   forming a second inter-conductor dielectric layer on said cell,
   forming a third conductor layer over said cell and patterning said third conductor layer to form a first resistor connected to said self-aligned contact region.

2. A method in accordance with claim 1 including:
   forming said self-aligned contact regions to said source region and said drain region with an interconnection to said buried contact.

3. A method in accordance with claim 1 including:
   said first conductor layer comprising a layer selected from the group of polysilicon and polysilicon/polycide.

4. A method in accordance with claim 1 including:
   said second conductor layer comprising a lamination of polysilicon and tungsten silicide.

5. A method in accordance with claim 1 including:
   said hard silicon oxide mask layer being composed of a material formed from the group consisting of PETEOS and LPTEOS.

6. A method in accordance with claim 1 including:
   said first inter-conductor dielectric layer being composed of a material formed from the group consisting of LPTEOS and PETEOS.

7. A method in accordance with claim 1 including:
said second inter-conductor dielectric layer being composed of a material formed from the group consisting of LPTEOS and PETEOS.

8. A method of forming an SRAM transistor cell on a well in a semiconductor substrate thereof by the steps as follows:
forming a gate oxide layer over said well,
forming a split polysilicon layer over said gate oxide layer,
forming buried contact areas in a well in said substrate etching away portions of said split polysilicon layer and said gate oxide layer,
forming buried contact regions in said well,
deposition of a lower conductor layer selected from the group consisting of a polysilicon layer and a lamination of a polysilicon layer and a polycide layer,
patterning said lower conductor layer into a gate conductor electrode,
LDD photolithography and ion implanting LDD regions into said well adjacent to said gate conductor electrode,
forming spacers adjacent to said gate conductor electrode,
forming source/drain regions by photolithography and ion implanting,
forming a first inter-conductor dielectric layer on said cell,
defining a self-aligned contact region in said cell above at least one of said source/drain regions,
forming a second conductor layer over said cell and patterning said second conductor layer to form a via in said self-aligned contact region,
forming a second inter-conductor dielectric layer on said cell,
forming a third conductor layer over said cell and patterning said third conductor layer to form a first resistor connected to said self-aligned contact region.

9. A method in accordance with claim 8 including:
forming said self-aligned contact regions to said source region and said drain region with an interconnection to said buried contact.

10. A method in accordance with claim 8 including:
said first conductor layer comprising a layer selected from the group of polysilicon and polysilicon/polycide.

11. A method in accordance with claim 8 including:
said second conductor layer comprising a lamination of polysilicon and tungsten silicide.

12. A method in accordance with claim 8 including:
said hard silicon oxide mask layer being composed of a material formed from the group consisting of PETEOS and LPTEOS.

13. A method in accordance with claim 8 including:
said first inter-conductor dielectric layer being composed of a material formed from the group consisting of LPTEOS and PETEOS.

14. A method in accordance with claim 8 including:
said second inter-conductor dielectric layer being composed of a material formed from the group consisting of LPTEOS and PETEOS.

15. A method of forming an SRAM transistor cell on a doped semiconductor substrate by the steps as follows:
forming a gate oxide layer over said substrate,
forming a split polysilicon layer on said gate oxide layer,
forming buried contact areas in a well in said substrate etching away portions of said split polysilicon layer and said gate oxide layer,
forming a lower conductor layer selected from the group consisting of a polysilicon layer and a lamination of a polysilicon layer and a polycide layer over said split polysilicon layer and reaching down into contact with said substrate in said buried contact areas,
forming a hard silicon oxide mask layer over said first conductor layer,
defining gate conductors from said first conductor layer,
forming lightly doped source/drain regions in said well,
forming spacers in said well,
forming source/drain regions in said well,
forming a first inter-conductor dielectric layer on said cell,
defining a self-aligned contact region in said cell above at least one of said source/drain regions,
forming a second conductor layer over said cell and patterning said second conductor layer to form a via in said self-aligned contact region,
forming a second inter-conductor dielectric layer on said cell,
forming a third conductor layer over said cell and patterning said third conductor layer to form a first resistor connected to said self-aligned contact region,
forming a first pass transistor and a second pass transistor, each having a source region, a drain region and a gate conductor,
forming a first pull-down transistor and a second pull-down transistor each having a source region, a drain region and a gate conductor,
forming a first node and a second node,
forming a first load resistor having one end connected to said first node and the other end thereof connected to said power supply connection,
forming a second load resistor having one end connected to said second node and the other end thereof connected to said power supply connection,
forming a bit line and a bit line bar,
forming first and second interconnection lines,
said first pull-down transistor having the drain region thereof connected to said first node,
said second pull-down transistor having the drain region thereof connected to said second node,
said first and second pull-down transistors having the source regions thereof connected together,
said first node cross connected via said first interconnection line to the gate conductor of said second transistor,
said second node cross connected via said second interconnection line to the gate conductor of said first transistor,
said gate conductors of said first and second pass transistors connecting to a wordline,
connecting said drain region of said first pass transistor to said first node,
connecting said drain region of said second pass transistor to said second node,
connecting said source region of said first pass transistor to said bit line bar, and
connecting said source region of said second pass transistor to said bit line.

* * * * *